US005742322A

United States Patent [19]

Cranton et al.

[11] Patent Number: 5,742,322

[45] Date of Patent: Apr. 21, 1998

[54] AC THIN FILM ELECTROLUMINESCENT DEVICE

[75] Inventors: Wayne Cranton, West Yorkshire; Robert Stevens, Wakefield; Clive Thomas, Leeds, all of England

[73] Assignee: Ultra Silicon Technology(UK) Limited, England

[21] Appl. No.: 293,540

[22] Filed: Aug. 19, 1994

[30] Foreign Application Priority Data

Aug. 20, 1993 [GB] United Kingdom .................. 9317408

[51] Int. Cl.[6] .............................. B41J 2/45; B41J 2/385; H01L 29/04; H01L 31/036; H01L 31/0376; H01L 31/20

[52] U.S. Cl. ........................... 347/238; 347/130; 257/57

[58] Field of Search .................................. 347/238, 112, 347/132; 428/690; 313/502, 503; 257/53, 57, 84

[56] References Cited

U.S. PATENT DOCUMENTS

| | | | |
|---|---|---|---|
| 4,899,184 | 2/1990 | Leksell et al. | 347/132 |
| 5,025,321 | 6/1991 | Leksell et al. | 347/225 |
| 5,258,690 | 11/1993 | Leksell et al. | 313/512 |
| 5,314,759 | 5/1994 | Harkonen et al. | 428/690 |
| 5,384,517 | 1/1995 | Uno | 315/169.3 |
| 5,432,015 | 7/1995 | Wu et al. | 428/690 |

FOREIGN PATENT DOCUMENTS

| | | |
|---|---|---|
| 0 466 746 A2 | 9/1991 | European Pat. Off. . |

*Primary Examiner*—Benjamin R. Fuller
*Assistant Examiner*—Thinh Nguyen
*Attorney, Agent, or Firm*—Sheridan Ross, P.C.

[57] ABSTRACT

A thin film electroluminescent device, comprising a first electrode layer, first and second dielectric layers with an active phosphor layer disposed therebetween, and a second electrode layer, wherein there is provided within the phosphor layer at least one barrier layer comprising a thin layer of dielectric material.

An array of such devices placed side to side is provided with a print head suitable for A4 electrographic printing.

12 Claims, 12 Drawing Sheets

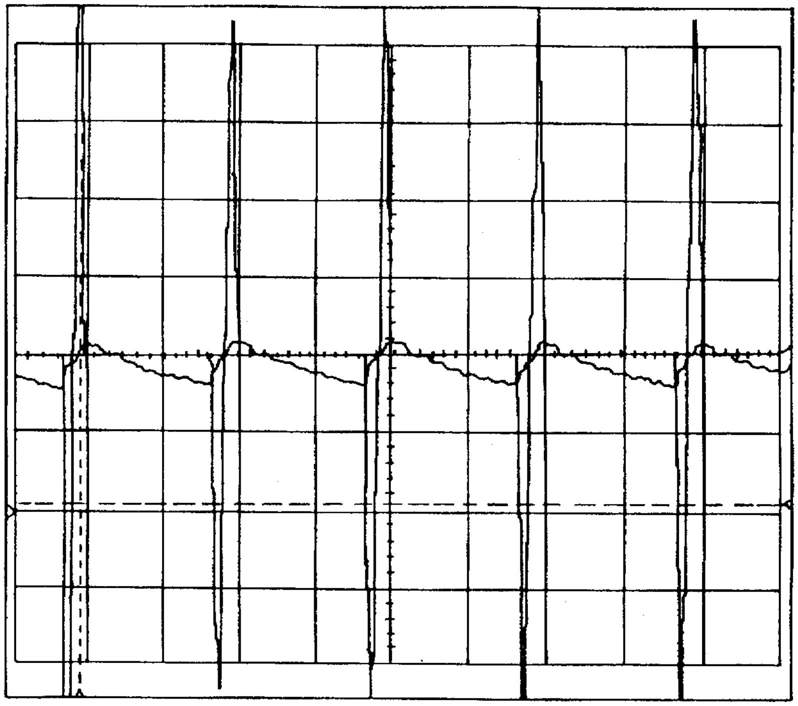
Fig.11.
Fig.12.
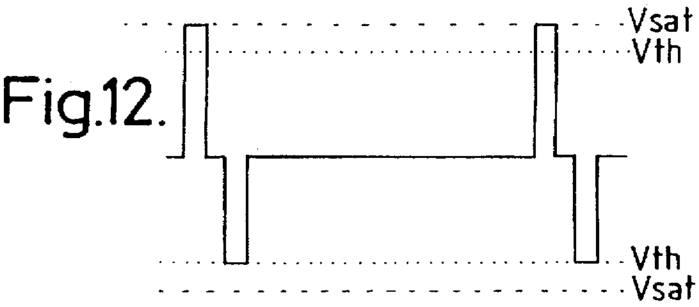
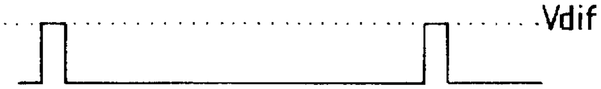
Fig.13.
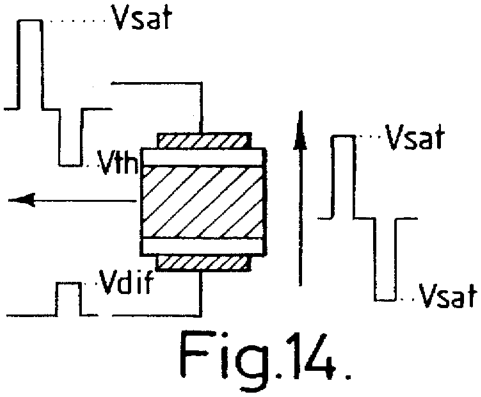
Fig.14.

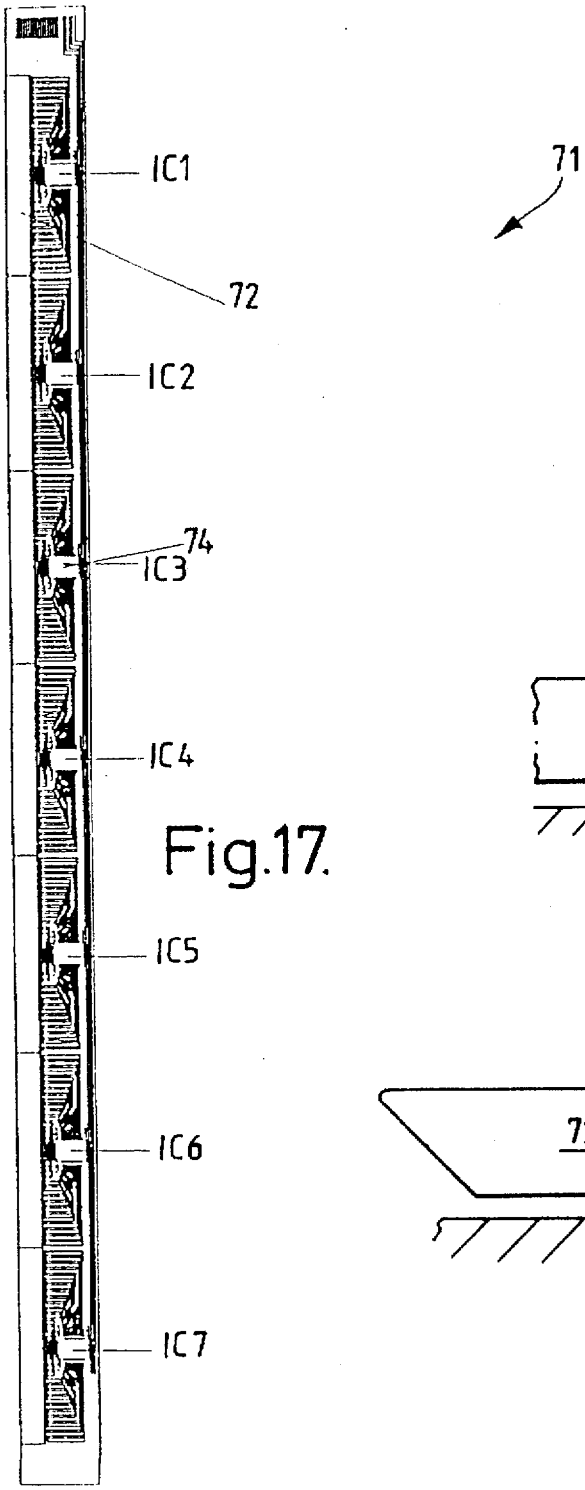
Fig.17.
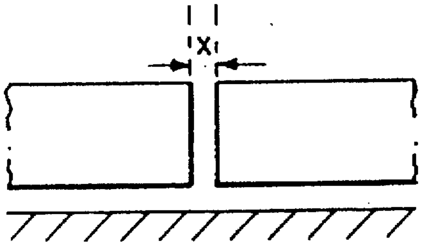
Fig.17a(i)
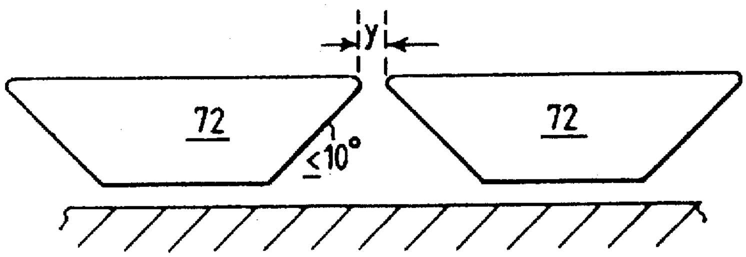
Fig.17a(ii)

AC THIN FILM ELECTROLUMINESCENT DEVICE

The present invention relates to an AC thin film electroluminescent device (hereinafter referred to as an ACTFEL device) and particularly, though not exclusively, to an ACTFEL device in which only the laterally emitted light is utilised, know as a LETFEL device, intended for use in an electrophotographic (laser) printer.

It is known from U.S. Pat. No. 4,535,341 (Kun et al, Assignee Westinghouse Electric Corporation) to provide a thin film electroluminescent (TFEL) edge emitter comprising a common electrode layer, first and second dielectric layers with a phosphor layer disposed therebetween and an excitation electrode layer, the whole being disposed on a substrate layer.

It has also been proposed (see U.S. Pat. No. 5,043,631 to Kun et al, Assignee Westinghouse Electric Corporation) to combine such a light source with integrated circuits formed in the substrate layer, wherein the integrated circuits control the illumination of the individual pixels of the TFEL structure, for use in, for example, light activated printer.

It is the aim of the present invention to provide an improved ACTFEL device which has increased luminous efficiency compared to prior art devices.

According to a first aspect of the present invention there is provided a thin film electroluminescent device comprising a first electrode layer, first and second dielectric layers with an active phosphor layer disposed therebetween, and a second electrode layer, wherein there is provided within the phosphor layer at least one barrier layer comprising a thin layer of insulating material having a dielectric constant greater than that of the phosphor layer.

There may be a single barrier layer, or alternatively at least two barrier layers are provided within the phosphor layer.

Conveniently, the phosphor layer comprises ZnS:Mn and the dielectric layers (including the barrier layer(s) are selected from a choice of ZnSe, SiN, $Al_2O_3$, $Y_2O_3$ or Barium Titanate, of combinations of these, the most preferred materials being $Y_2O_3$ and insulators whose dielectric constants are greater than that of the phosphor layer.

Preferably, the or each barrier layer is a minimum of 100 Å thick and not greater than 500 Å thick, whilst the overall thickness of the phosphor layer (measured from the first dielectric layer to the second dielectric layer) is not less than 2000 Å. Preferably, where there are two barrier layers these are placed equidistantly from each other and at equal distance from the closest dielectric layer.

Conveniently, the device is disposed on a substrate which can be metallised glass, glass coated with transparent and conducting material, barium titanate or any other ceramic, but is preferably either single crystal silicon or polycrystalline silicon.

The layers are deposited by any suitable means, including sputtering, electron beam deposition, molecular beam and atomic-layer deposition epitaxy.

Typically, a number of devices according the present invention would be deposited side by side to form a row for use as a printing array. In this case it has been found that the inclusion of $SiO_2$ of SiN (or any other suitable, low refractive index dielectric) between the individual devices provides waveguiding in the plane parallel to the plane of the substrate. The brightness can be improved by approximately 40% by introducing a curvature to the side walls of the $SiO_2$ either side of each device.

In a conventional ACTFEL device (i.e. one without the barrier layers), electrons will be emitted from interface states and produce emission within the active electroluminescent (phosphor) layer by impact excitation of the luminescent centres, included within the phosphor layer (see FIG. 1*a*), by "hot" electrons energised by applied electric fields of the order of $10^6$ $Vcm^{-1}$. The source of the electrons are trapping states at the interfaces between the phosphor and the insulating layers. Band-bending arising from positive space charge accumulation created by electron emission in the region of the interface, and arguably higher resistivity phosphor material close to the dielectric layers, are the only factors preventing the applied electric field being dropped uniformly across the entire phosphor layer. Hence, the high field regions generate higher energy electrons with a concomitant enhancement of the excitation efficiency within these regions.

In the present invention, the thin, 100 Å barrier layers of $Y_2O_3$ within the phosphor film modify the field distribution as shown in FIG. 2(*b*). Thus, there are additional high filed regions which act as a series of accelerating regions and thereby enhance the brightness of the device, as is illustrated in FIG. 3.

According to the first aspect of the present invention there is further provided a printing array comprising a number of individually addressable devices according to the fifth to tenth paragraphs hereof, and means for applying an ac drive signal to a group of devices via one of said two electrode layers and means for applying an in-phase low voltage signal to individual devices to be addressed, via the other of said two electrode layers such that the total field applied is sufficient to activate the addressed device.

Once activated, the light from the device is emitted from the edge and is projected onto a photoreceptive drum by a Graded Refractive Index (GRIN) lens. The imaging is one to one, so that the emitting area of each individual device corresponds to the printed pixel size on the drum.

According to a second aspect of the present invention there is provided a printing array comprising a number of individually addressable thin film electroluminescent devices and means for applying an ac drive signal to a group of devices via one of said two electrode layers and means for applying an in-phase low voltage signal to individual devices to be addressed, via the other of said two electrode layers such that the total field applied is sufficient to activate the addressed device.

Embodiments of the present invention will now be described, by way of example only, and contrasted with the prior art, with reference to the accompanying drawings, in which:

BRIEF DESCRIPTION OF THE DRAWINGS

FIG. 1(*b*) is an energy band diagram for the conventional ACTFELD device of FIG. 1(*a*);

FIG. 1(*c*) illustrates by means of an energy band diagram the electroluminescent process of the conventional device of FIG. 1(*a*);

FIG. 2(*b*) is an energy band diagram for the device of the present invention;

FIG. 4(*a*) illustrates schematically a device according to the present invention having a single barrier layer;

FIG. 4(*b*) is a graphical representation of the brightness-voltage curves of a conventional device and devices according to the invention have a single barrier layer and two barrier layers respectively;

FIG. 11 illustrates the variation of intensity with time;

FIGS. 12, 13 and 14 collectively illustrate the electrical drive scheme for an individual device of the present invention;

FIG. 17 illustrates schematically a hybrid consisting of a number of the devices of the present invention;

FIGS. 17(*a*)(i) and 17(*a*)(ii) compare the butting together of regular cut die with that of undercut die.

DETAILED DESCRIPTION

Figure 1A:
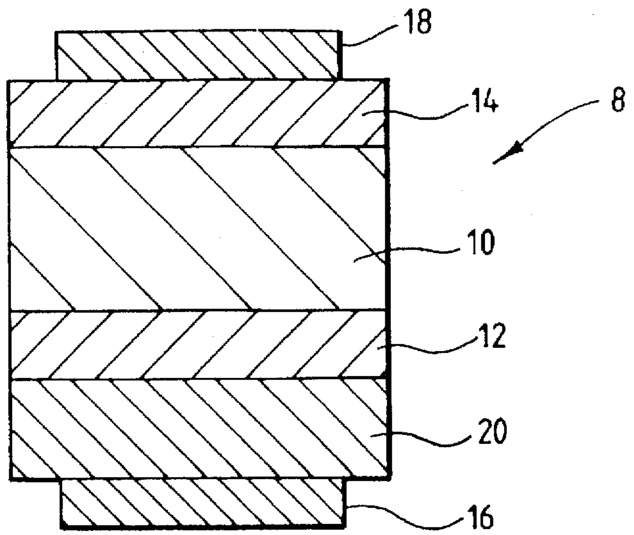
FIG. 1(*a*) is a schematic cross-section through a conventional ACTFELD device.
Figure 1C:
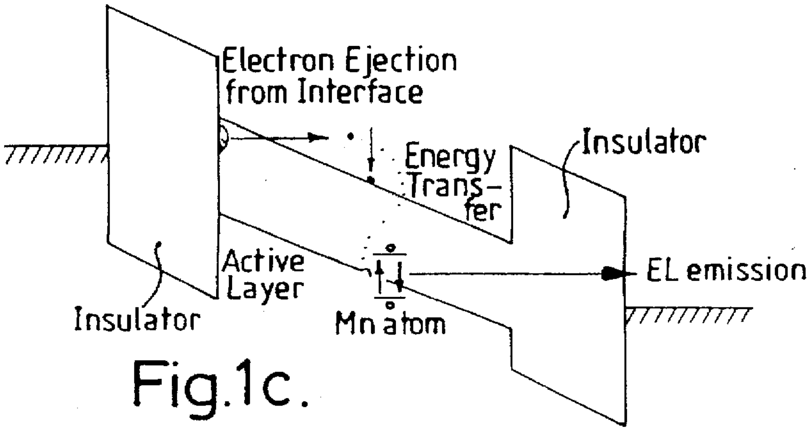
Figure 1B:
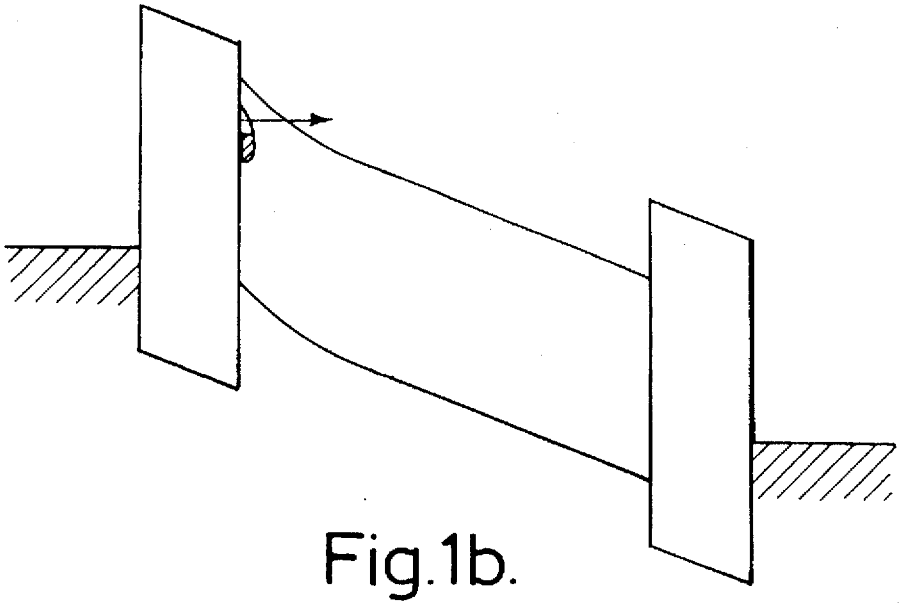

Referring to the drawings, the basic structure of a conventional ACTFELD device 8 is shown in FIG. 1(*a*) and comprises an active phosphor layer such as ZnS:Mn interposed between two insulating (dielectric) layers 12, 14 (such as $Y_2O_3$), the device being disposed on a silicon substrate 20. In operation, a field is applied across the device by means of two electrodes 16, 18.

One of the fundamental characteristics of ACTFELD operation is field clamping across the phosphor layer 10—it has been shown that the field across the phosphor layer 10 in a typical conventional ACTFELD device is clamped at a value which is well below that for maximum excitation efficiency of the luminous centre.

The Applicants have found surprisingly that the luminous properties are dramatically improved by the inclusion of at least one thin (about 100 Å) barrier layer of a high dielectric constant material such as $Y_2O_3$ which has a relative dielectric constant of $\epsilon_r$=16. The inclusion of such a barrier layer or layers redistributes the field across the active layer. Electron tunnelling through these layers is implied as the transport mechanism which allows the higher field regions adjacent the barrier layers to act as accelerating regions, thereby improving the efficiency.

Figure 2A:
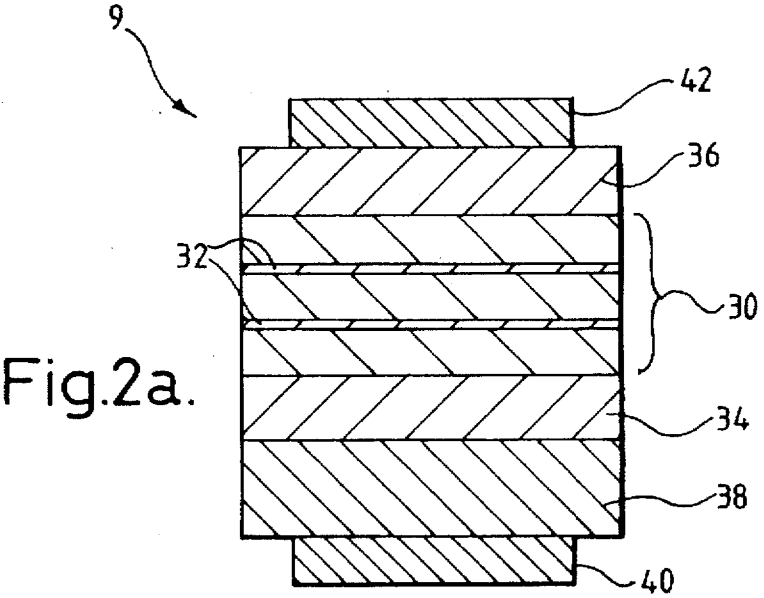
FIG. 2(*a*) is a schematic cross-section through a device in accordance with the present invention, having two barrier layers.
Figure 2B:
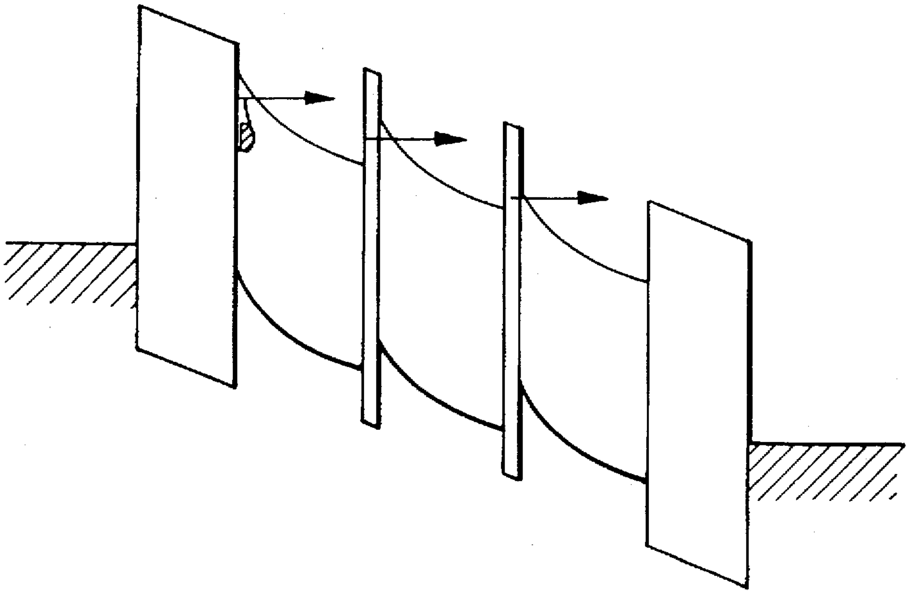

A device 9 of the invention is illustrated in FIG. 2(*a*) and comprises a phosphor layer 30 of ZnS:Mn having two thin barrier layers 32 of $Y_2O_3$ included therein and disposed on a silicon substrate 38. The field is applied by means of lower electrode 40 and upper electrode 42.

As illustrated in FIG. 1(*c*), for the conventional ACTFEL device under normal operating conditions electrons will be emitted from interface states and produce emission within the active electroluminescent layer 10 by impact excitation of the luminescent centre (Mn atoms) associated with the phosphor layer 10.

The dramatic improvement in efficiency brought about by inclusion of the barrier layers may be understood by considering the field distribution within the phosphor layer during activation. FIG. 1(*b*) shows the energy band diagram for the conventional device and FIG. 2(*b*) illustrates the energy band diagram for the device of the present invention when both devices are in the "on" state. As shown in FIG. 1(*b*) field clamping is indicated by the constant slope of the energy bands throughout the bulk of the active phosphor layer. At the cathodic interface however there will be a degree of band bending with associated higher field, due to the accumulation of space charge in the region of the interface. The curvature of the band bending is given by Poisson's equation $\delta V/\delta x^2=\rho^2$, hence the curvature is positive in the cathode region where the associated space charge accumulation will be positive.

By inserting barrier layers within the active film of an ACTFELD the applicants have created extra regions where this positive charge accumulation may occur, resulting in a series of high field accelerating regions which increase the average energy of excitation, and therefore the luminous efficiency. This is illustrated in FIG. 2(*b*). The electrons originate at the interface between the cathode insulating layer and the phosphor film, as in the conventional device, and are shown tunnelling through the barrier layers 32 to be re-accelerated by the high field regions. Tunnelling is implied as the transport mechanism by the Q-V measurements which show a decrease in transferred charge when the barrier layers 32 are present. The only other explanation is that the extra intrfaces produced by inclusion of the barrier layers 32 are acting as a source of electrons in addition to the cathode interface, but this is unlikely to be the mechanism responsible because the transferred charge would in this case be found to increase rather than decrease.

Figure 4:
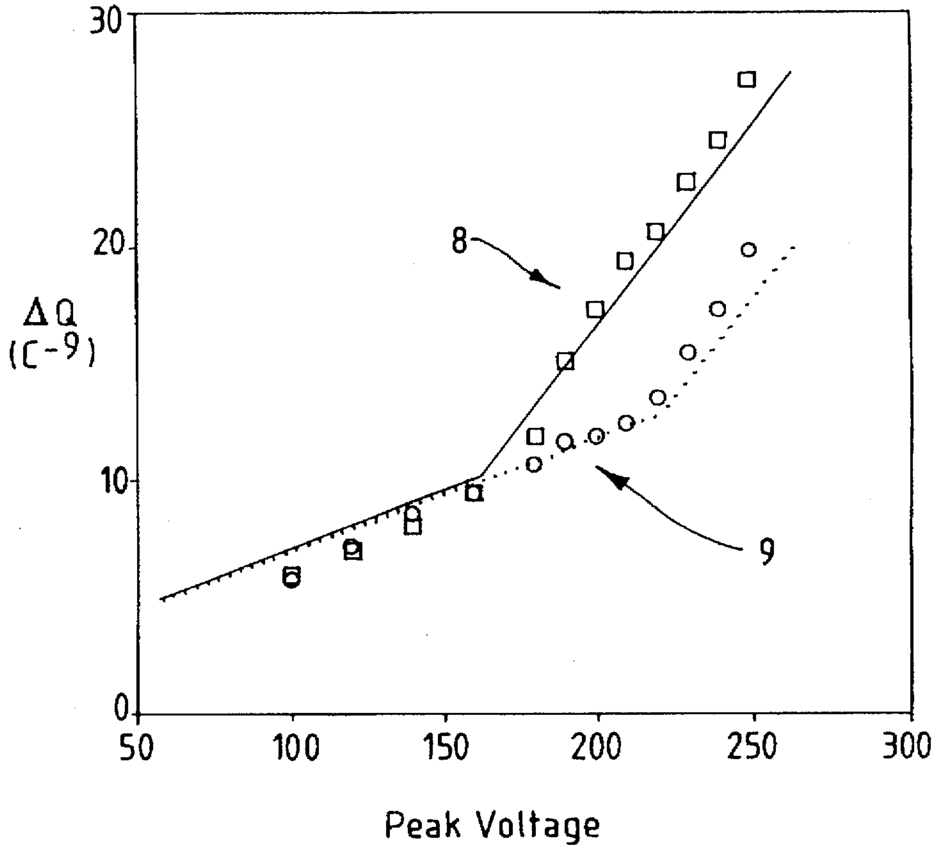
FIG. 4 illustrates graphically the transferred charge-voltage characteristics of the device of the present invention, compared to those of a conventional device.
Figure 4A:
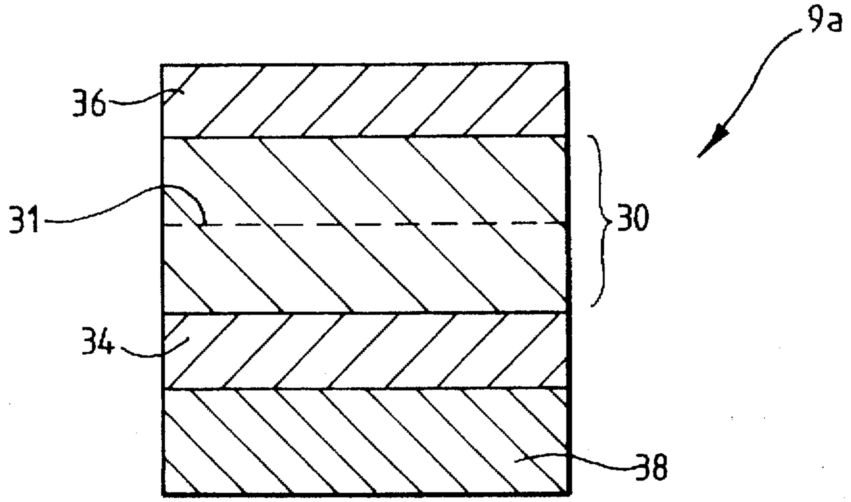
Figure 4B:
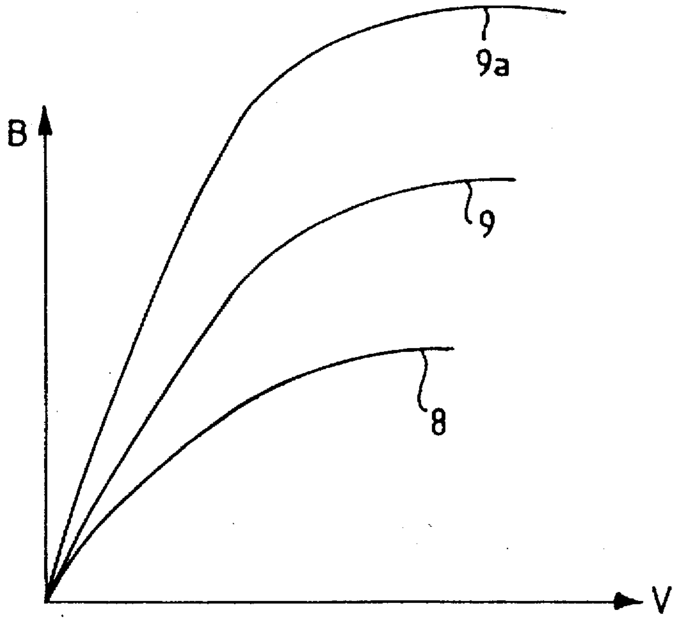

Illustrated in FIG. 4(*a*) is an alternative device according to the invention which comprises a single barrier layer 31, all of the materials being the same and referenced by the same numerals as in FIG. 2(*a*).

It has been found that in experimental results, a single barrier layer device **9*a* compares favourably in its brightness/voltage curve with both the conventional device 8 and the two-layer device 9 (see curves 8, 9 and 9*a* in FIG. 4**(*b*)), the single layer device **9*a* giving a maximum of 200,000 f-L, the two layer device 9 giving a maximum of 90,000 f-L and the conventional device 8** giving a maximum of 40,000 f-L.

The Applicants are still investigating the optimum parameters for maximum efficiency, such as layer thickness and number of layers etc., in order to produce high efficiency ACTFELDs for display and image bar applications.

EXAMPLE

ACTFEL devices of the structures shown in FIGS. 1(*a*) and 2(*a*) were deposited onto 100 mm diameter $n^{++}$ substrates by RF-magnetron sputtering, using a multi-electrode system. A rotating substrate holder/heater unit ensures a uniform film deposition, with the substrate temperature held at 200° C. In situ interferometric thickness monitoring was used to control the deposition in order to obtain the required thicknesses. Following deposition, the structures were annealed in vacuum at 500° C. for one hour. Aluminium electrodes were then deposited by thermal evaporation, with the top electrodes evaporated through an out of contact metal mask to delineate 1 mm wide lines.

Examination of the luminous properties of the device was achieved by cleaving the silicon substrate in a direction perpendicular to the line electrodes thus exposing an emitting edge. The luminous efficiency of such lateral emission is an order of magnitude greater than surface emission, and permits direct comparisons between different device structures.

Figure 3:
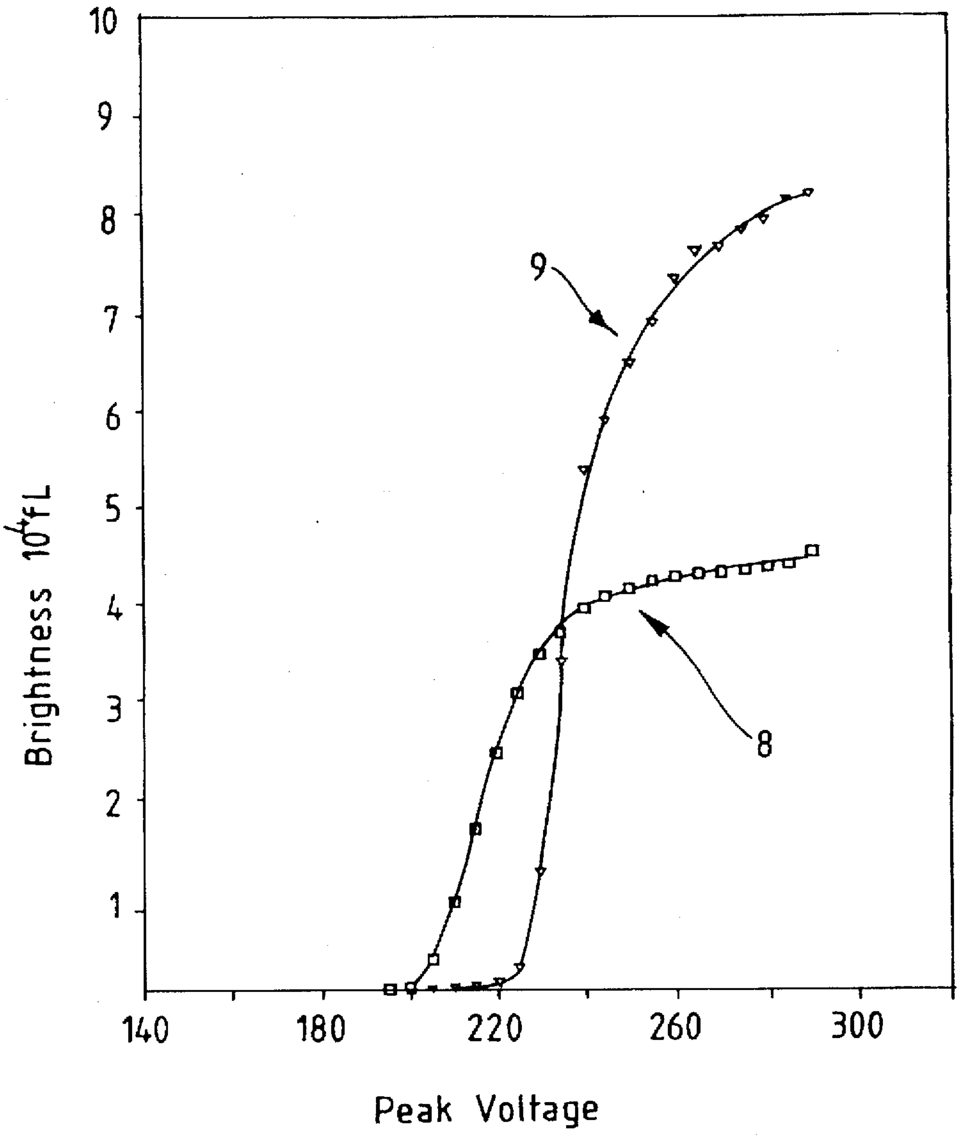
FIG. 3 is a graphical representation of the brightness-voltage characteristics of the device of the present invention, compared to those of a conventional device.

Brightness-voltage characteristics were measured using a Minolta LS110 luminance meter, calibrated in fL, which measures brightness over an aperture of 1.1 mm diameter. Luminous emission from the ACTFELDs was thus determined by extrapolating the measured brightness over the emitting area to the actual emitting area, which for both devices examined was 0.8 microns by 1 mm. In addition to the luminous properties, the charge-voltage (Q-V) characteristics were examined by the Sawyer-Tower method, where a large sense capacitance (1 μF) is used to monitor the charge flow in the external circuit, i.e. the charge transferred within the ACTFELD. The results are shown in FIGS. 3 and 4, with the important results being a large increase in saturation brightness for the device 9 of the invention (see FIG. 3), accompanied by a decrease in the amount of the transferred charge (see FIG. 4), when compared with the conventional device 8. The brightness increases by a factor of 2 with a halving of the transferred charge, indicating a four-fold increase in luminous efficiency, since the amount of charge transferred is directly proportional to the power consumption, and efficiency may be defined as luminous intensity divided by the power dissipated.

For printing applications only the lateral (or edge) emitted light is utilised from ACTFEL devices, and ACTFEL devices utilised in this way are known as LETFEL devices. The barrier layer device according to the present invention has been utilised by the Applicants in the production of a printing array of individually addressable LETFEL devices, a section of which is shown in FIG. 5 which also shows how matrix addressing is possible via the upper and lower electrode contacts.

The array is capable of imaging across an 8" width at 600 dpi, and comprises individually addressable LETFEL pixels fabricated as a linear array where each pixel has a width of 42 microns, i.e. there are 600 pixels per inch of LETFEL array.

Figure 6:
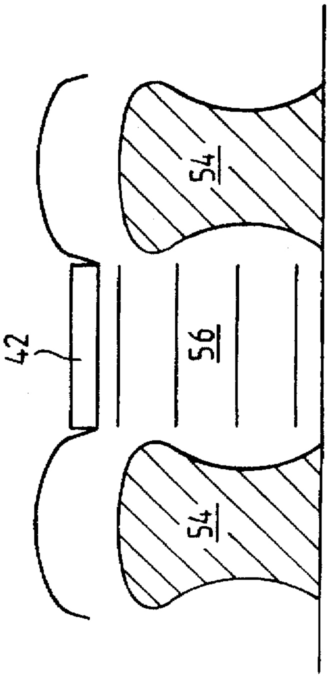
FIG. 6 illustrates schematically and in cross-section the curvature of the $SiO_2$ sidewalls.

The structure comprises a silicon substrate 50, a silicon dioxide or silicon nitride layer 52, polysilicon group electrodes 40, a silicon dioxide layer 54 in the form of a series of walls having channels therebetween filled with the multilayer LETFEL structure 56 of $Y_2O_3$/ZnS:Mn with the barrier layers of $Y_2O_3$ included. This active layer 56 is disposed primarily between the walls 54 but also extends above them. Upper high voltage aluminium electrodes 42 are disposed above the layer 56 between the walls 54. It has been found that introducing a curvature to the sidewalls of walls 54 as shown in FIG. 6 improves the brightness by approximately 40%.

Figure 5:
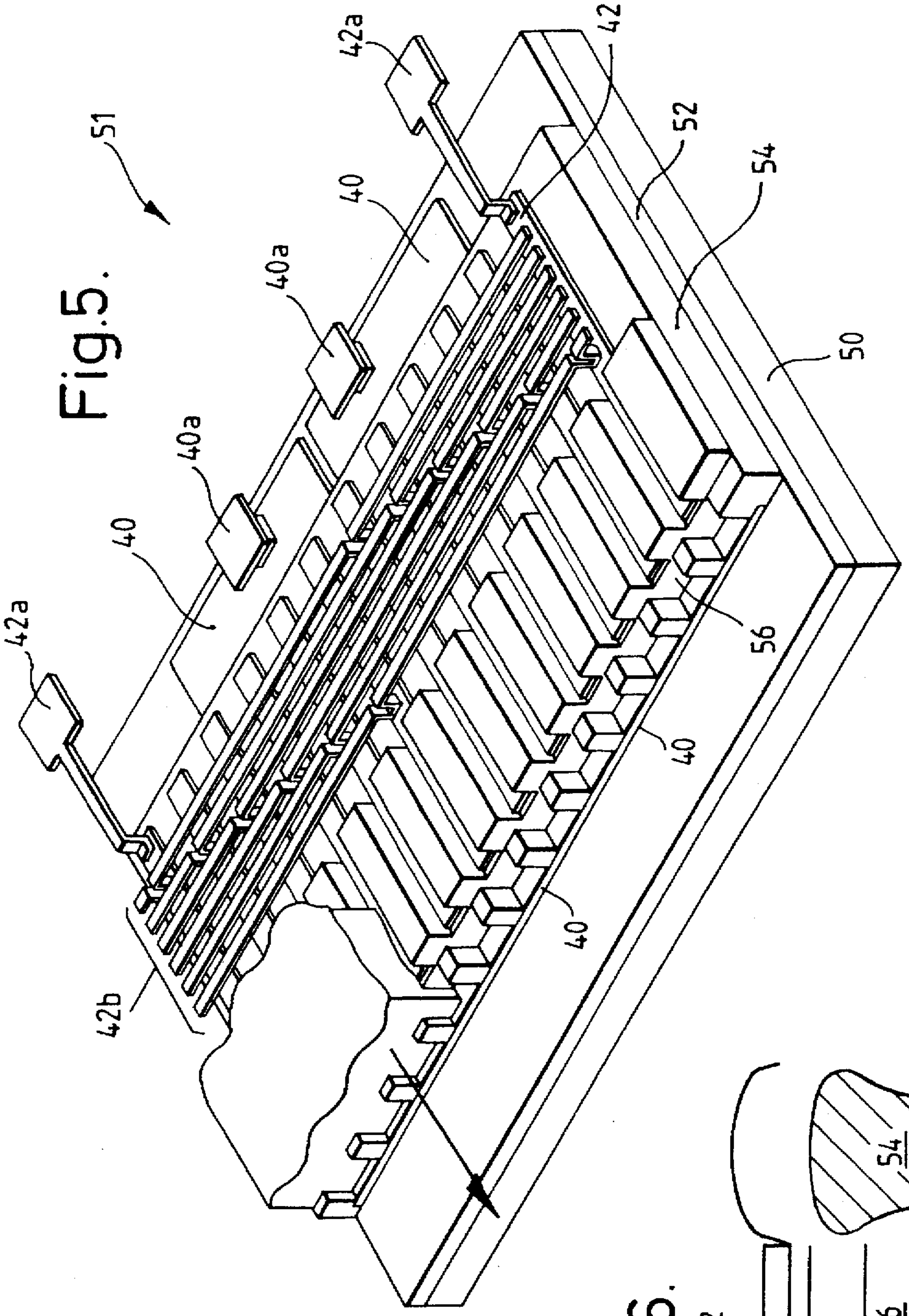
FIG. 5 illustrates the structural arrangement of the array of the present invention on a silicon substrate.

As can be seen in FIG. 5, two groups of six LETFELs are illustrated, each group having a common lower electrode 40, and each individual LETFEL has a separate upper electrode 42, with corresponding electrodes 42 from each group in the array being connected together via aluminium high voltage pulse interconnect lines **42*b*. Power is applied to group electrodes 40 via low voltage control bondpads 40*a* and to the electrodes 42 via high voltage pulse bondpads 42*a***.

Activation of an individual LETFEL device occurs when the total field applied across it is greater than the threshold required for electroluminescence. The upper high voltage electrodes 42 carry an ac drive signal (illustrated in FIG. 12) that has a peak voltage just below the threshold voltage $V_{th}$. An in-phase low voltage signal (illustrated in FIG. 13) applied to the lower electrode 40 of the device to be addressed is superimposed upon this high voltage signal, so that the total field applied is sufficient to activate the LETFEL. The address circuitry utilises column drivers such as the SuperTex HV77 to switch the low voltage signal to the required LETFEL devices.

Figure 7:
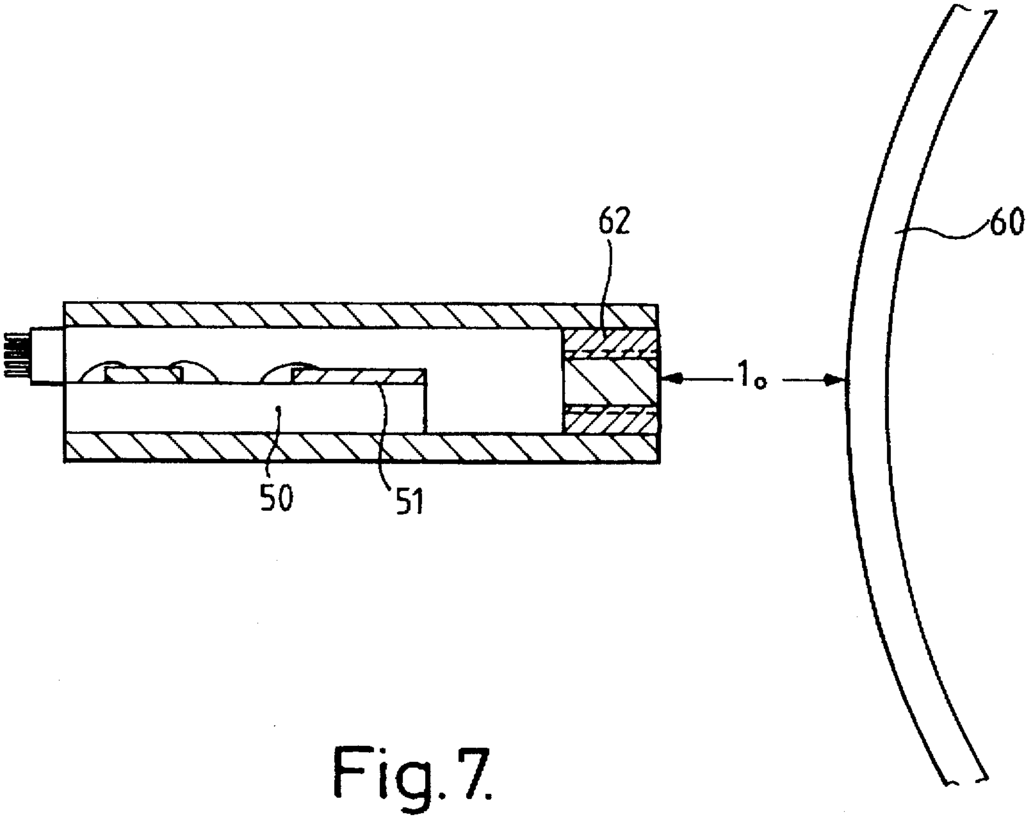
FIG. 7 is a schematic cross-section of an electrographic print head incorporating an array of the present invention.

Once activated, the light from a LETFEL device is emitted from the edge and is projected onto the photoreceptive drum 60 by a GRIN lens 62 (see FIG. 7). The imaging is one to one, so that the emitting area of each LETFEL device corresponds to the printed pixel size on the drum.

Figure 8:
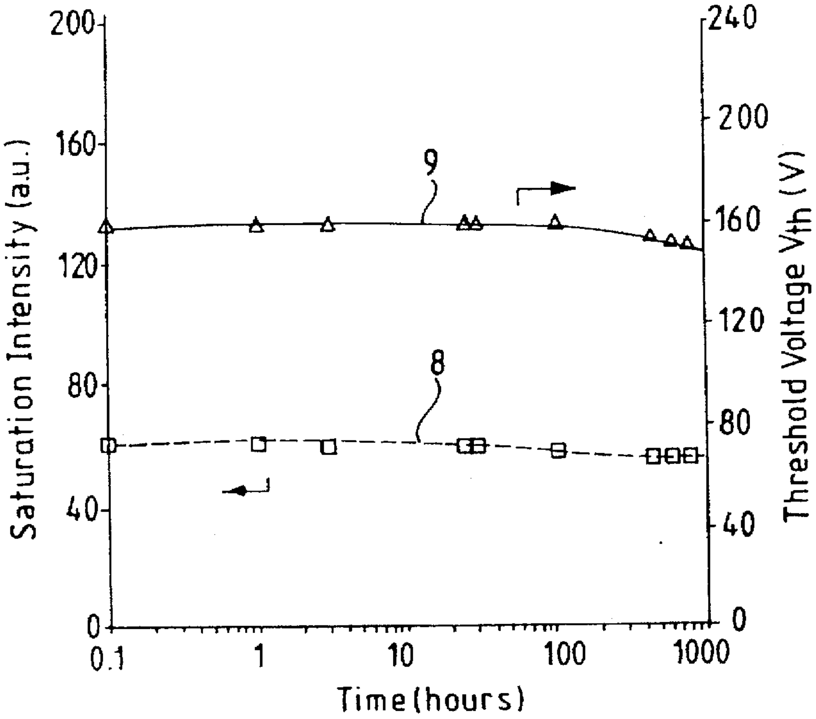
FIG. 8 illustrates graphically the aging characteristics of the array of the present invention compared to those of a conventional array.

The present invention is clearly applicable to high resolution electrographic printing, with the addressability, resolution and intensity requirements satisfied by suitable fabrication techniques. Furthermore, the intensity variation due to the application of an alternating drive signal is limited to ±10% of a value that can be tailored to be well in excess of the drum sensitivity; continuous activation of the photoreceptive drum is therefore produced when a LETFEL device is "on". Finally, the lifetime characteristics of a typical device according to the invention illustrated by line 9 in FIG. 8 illustrate that an array of LETFELs will operate with only minor degradation of the luminous properties over a period well in excess of 1000 hours, which is equivalent to 480,000 pages, at 8 pages per minute.

Figure 9:
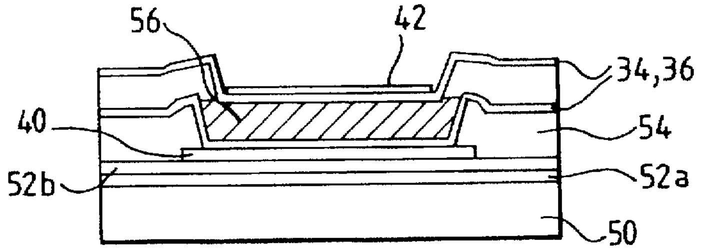
FIG. 9 is a view from one edge of the device according to the invention.

Referring now to FIG. 9, each LETFEL device comprises a silicon substrate 50, a silicon dioxide layer **52*a*, a silicon nitride ($Si_3N_4$) layer 52*b*, and a pixel group control electrode 40 fabricated from polysilicon. On top of this structure there is deposited the LETFEL itself, comprising two layers 34,36 of $Y_2O_3$ between which there is located the ZnS:Mn/$Y_2O_3$ barrier layer structure, and on top of the upper layer 36 there is a high voltage pulse electrode 42. To each side of the LETFEL there is silicon dioxide 54** which provides the necessary waveguiding.

Figure 10:
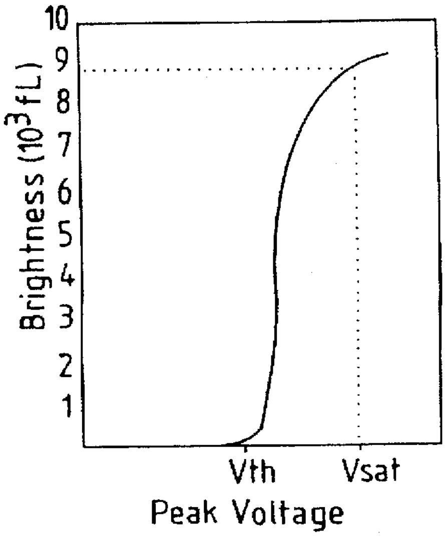
FIG. 10 illustrates graphically the brightness-voltage characteristics, threshold voltage and saturation voltage of the device of the present invention.

FIG. 10 illustrates the brightness-voltage characteristics of the LETFEL device of the present invention addressed by a continuous AC voltage. Depicted in FIG. 10 are the threshold voltage $V_{th}$ (corresponding to the voltage at which the device just switches on) and the saturation voltage $V_{sat}$ (corresponding to the voltage at maximum brightness). For use in printing operations, LETFEL devices are addressed by voltage pulses as will be explained later. Illustrated in FIG. 11 is the variation of intensity with time when voltage pulse-windows of 16.64 μs are applied at intervals of 100 μs. Examination of FIG. 11 reveals that the intensity I has an average value of I±10%.

The voltage waveform applied to the two electrodes 40,42 with the correct drive sequences result in control of the emission from the edge facet. The waveform applied to the high voltage pulse electrode 42 is shown in FIG. 12. The pulse repetition frequency in 10 KHz. The pulse widths are 4.16 μs with a 4.16 μs delay between the positive and negative pulse, with asymmetry of the amplitude. The positive pulse amplitude is set at $V_{sat}$ and the negative pulse amplitude is set at $V_{th}$.

As shown in FIG. 12, the bias of the HV pulse electrode is at ground potential during the absence of the pulse. The pulse-window is 16.64 μs with an off time of 83.2 μs between pulse-windows. Positive polarity pulses as shown in FIG. 13 are applied to the pixel group control electrodes 40 for switching the LETFEL devices either ON or OFF. The amplitude of these pulses is $+(|V_{sat}|-|V_{th}|)$; this value is termed the differential amplitude $V_{dif}$, as shown in FIG. 13. For the LETFEL device of the present invention, $V_{dif}$ is 50 volts.

To switch on the LETFEL, the voltage across the device must reach $|V_{sat}|$ on both the positive and negative voltage excursions as shown in FIG. 14. The HV pulse waveform is asymmetric; the positive pulse amplitude is $V_{sat}$ while the negative pulse is $V_{th}$. When a positive pulse of amplitude $V_{dif}$ is applied simultaneously with the negative portion of the HV pulse, then the voltage across the device is $V_{sat}$ for both polarities. Therefore the LETFEL emits light during both cycles of the pulse.

Figure 15:
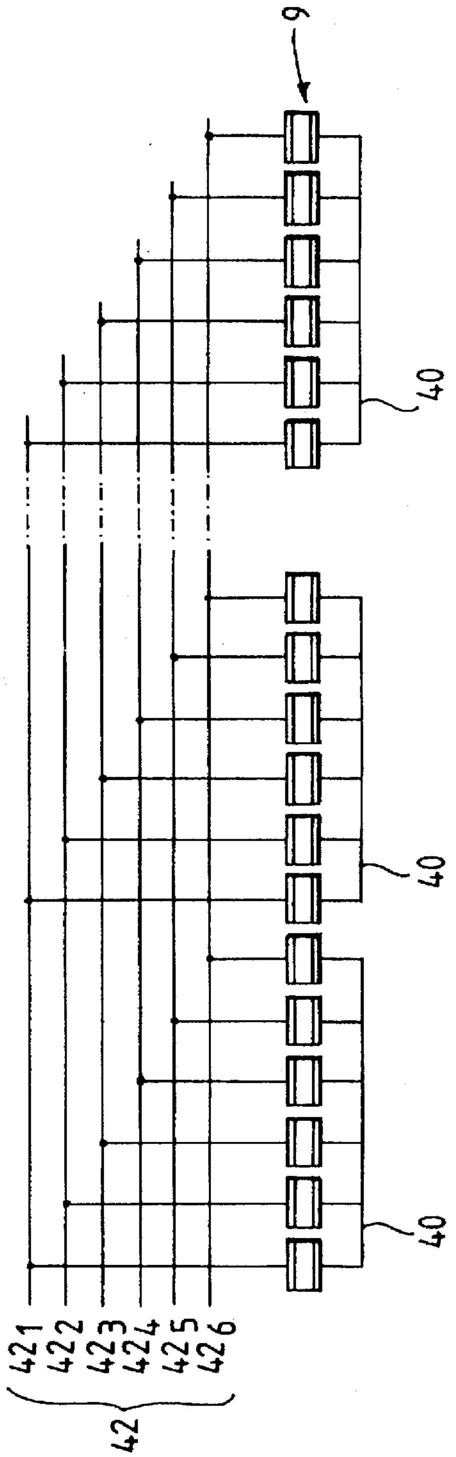
FIG. 15 illustrates schematically a matrix configuration for a 600 dpi electroluminescent printhead.
Figure 16:
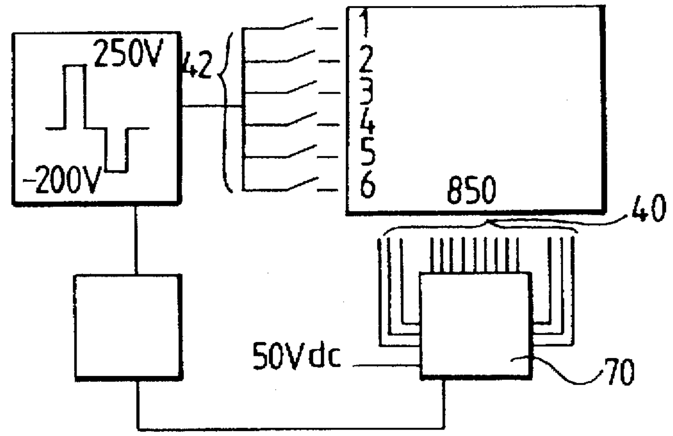
FIG. 16 is a block diagram illustrating the addressing circuit.

Shown in FIG. 15 is a matrix configuration for a 600 dpi electroluminescent printhead. For an 8.5 inch LETFEL linear array the matrix consists of six high voltage pulse electrodes 42 and 850 pixel control group electrodes, with six LETFELS in each group. The first LETFEL of each pixel group is connected to HV pulse line $\mathbf{42}_1$, the second to line $\mathbf{42}_2$, the third to line $\mathbf{42}_3$ etc. as illustrated in FIG. 15.

Illustrated in FIG. 9 is a block diagram which illustrates the addressing circuit. The high voltage pulses on one of the rows of the high voltage lines $\mathbf{42}_1$ to $\mathbf{42}_6$ are synchronised with the low voltage signals applied to the pixel control group electrodes 40. The high voltage is sequentially switched between the rows of the high voltage lines. The time taken for addressing all the high voltage lines before repetition is 100 μs.

The low voltage pulses are inputted in parallel to the pixel group control electrodes from low voltage column drivers 70; suitable column drivers are SuperTex HV577s. The pixel control group electrodes are common for six LETFEL devices—this number corresponds to the number of high voltage lines. Thus for example when a single high voltage line is addressed then 850 LETFELs are controlled simultaneously by a total of 13 column drivers. Note each column driver has 64 outputs.

A group of electroluminescent devices may be fabricated upon a silicon substrate to form a die, and a number of these die can then be butted together end to end to provide an electro-optic head of any required length. When butting the die together in this way the Applicants have found surprisingly that a considerable improvement in resolution may be achieved by undercutting the die to produce ends which are slanted by approximately 10% to the vertical as shown in FIG. 17(*a*)(ii). This avoids the problem of surface irregularities in the ends of the die and enable the gap y between the individual die to be reduced to as small as 10 μm for the undercut die as compared to about 25 μm (x) for regular cut die as shown in FIG. 17(*a*)(i). This much reduced gap comes much closer to the required spacing of 12 μm for 600 dpi printing utilising pixels of 30 μm width.

For example, shown schematically in FIG. 17 is a hybrid 71 consisting of LETFEL die butted end to end and bonded to the outputs of HV77s 74; for simplicity only seven HV77s are included rather than the thirteen necessary for 600 dpi printing. The die 72 have a length of 4.032 mm and a width of 2 mm. The length is chosen to correspond to a pitch of 42 μm, for LETFEL devices of 35 μm width and spacing of 7 μm. Each pixel group electrode is common for six LETFEL devices. A total of sixteen pixel control groups exists on each die. Hence the length of the die equals 6×16 42 μm (4.032 mm).

The hybrid 71 with a length of 8.5 inches, suitable for A4 printers, has 54 LETFEL die. For each LETFEL die electrical connection is made to six high voltage or upper electrodes 42 and sixteen pixel control group electrodes 40. Therefore a total of 22 bonds are required for each die. The total number of bonds per array is 22×54=1188. Shown schematically in FIG. 6 is a portion of a LETFEL die. Connection has to be made to each of the high voltage or upper electrodes 42 and also to the pixel control group electrodes 40. In this example only two pixel control group electrodes 40 are shown and also only two high voltage bond pads 42*a*.

The LETFEL array of the present invention is designed to provide A4 printing at a speed of 8 pages per minute (ppm) with a resolution of 600 dots per inch (dpi). Therefore the equivalent length of photoreceptor "exposed" per minute is 8×297 mm (297 mm corresponds to the length of one A4 sheet) equals 2376 mm (equivalent to 39.6 mm/second).

At 600 dpi a pixel has dimension 42.5 μm in width and 42.5 μm in length. However a LETFEL device has an emitting area of 35 μm×1.2 μm. The length of the pixel is created by multiple exposures of the drum to emission from a LETFEL device.

Therefore the time taken to generate the length of one pixel is 42.5 μm/39.6 mm/s=1.073 ms. For a time of 100 μs between pulse-windows, the number of exposures is 1.073 ms/100 μs equalling the application of 10 pulse-windows to a LETFEL. However, reference to FIG. 11 demonstrates that the intensity reduction between the pulse-windows is only 10% of the average intensity during the pulse-window. This reduction of the intensity still photosensitise the drum. Hence the pixel is continuous, and therefore greyscale is produced in the conventional manner.

Figure 18A:
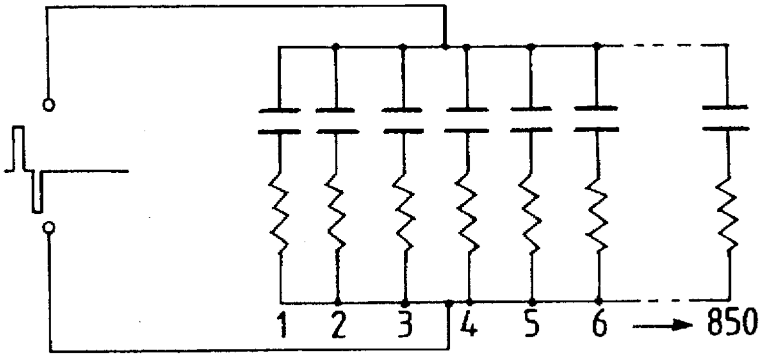
FIGS. 18(*a*) and 18(*b*) illustrate the power requirements of the array of the present invention.
Figure 18B:
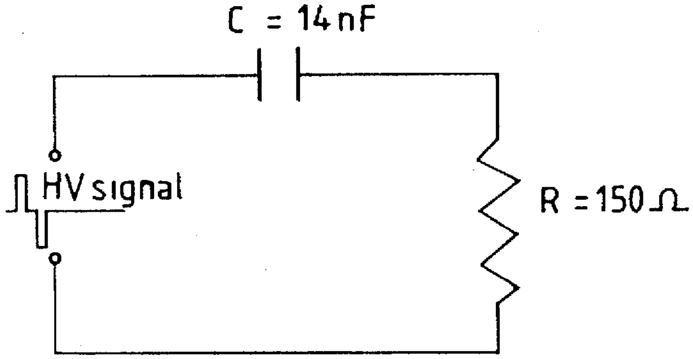

Each HV output of the power supply is connected to an RC network consisting of 850 LETFEL devices, as shown in FIG. 18(*a*). The capacitance of an individual LETFEL device in the "on" state is 16.5 pF, hence the total capacitance for each HV output is 14 nF. With a series resistance of 150 Ohms, the time constant of the network is 2 μs; a 4 μs pulse width is thus adequate to achieve full charging capacity. The power requirements may now be calculated by considering separately the power dissipation in the resistive ($P_R$) and capacitive ($P_C$) parts of the load network.

The drive waveform applied to each HV output is shown in FIG. 12 and consists of a pair of 4 μs pulses of opposite polarity separated by 4 μs, with a refresh time of 96 μs. Pulse pairs are applied sequentially to each of the six HV outputs, so that all 5100 LETFEL devices are addressed every 96 μs. The drive frequency is thus 62.5 KHz, but the operating frequency as applied to each LETFEL is 10.4 KHz.

The specifications for the LETFEL hybrid are detailed below:

| Physical Characteristics of LETFEL Hybrids | |
|---|---|
| Dimension of a LETFEL device | 35 μm × 1.9 mm |
| Separation between LETFEL devices | 7 μm |
| Number of LETFEL devices per die | 96 |
| Dimensions of a dice | 4.08 μm |
| Number of die per LETFEL array | 54 |
| Length of LETFEL array | 22.032 cm |
| Bonding Requirements | |
| Number of LETFEL die per array | 54 |
| Number of wirebonds per LETFEL dice | 22 |
| Number of HV77s per array | 14 |
| Number of wirebonds per HV77 | 86 |
| Total number of wirebonds per array | 2392 |

-continued

| | |
|---|---|
| Voltage Requirements | |
| Width of bipolar pulse window | 16.6 μs |
| Rise time of pulses | 2 μs |
| Fall time of pulses | 2 μs |
| Width of pulses | 4.16 μs |
| Positive High Voltage pulse | 250 V |
| Negative High Voltage pulse | 200 V |
| Frequency of High Voltage square-wave generator | 60 KHz |
| Power of High Voltage square-wave | 60 W |
| Switching voltage to HV77s | 50 Vdc @ 10 W |
| Optics | |
| Lens system | GRIN lens HR12A |

We claim:

1. A thin film electroluminescent device consisting essentially of a first electrode layer, first and second dielectric layers with an active phosphor layer having a dielectric constant associated therewith disposed therebetween, and a second electrode layer, characterized in that there is provided within the phosphor layer at least one barrier layer that does not emit light, said barrier layer comprising a thin layer of insulating material having a dielectric constant greater than that of the phosphor layer, said barrier layer having a thickness of at least one hundred angstroms.

2. A device according to claim 1 wherein there is provided within the phosphor layer a single barrier layer.

3. A device according to claim 1 wherein at least two barrier layers are provided within the phosphor layer.

4. A device according to claim 1 wherein the phosphor layer comprises ZnS:Mn.

5. A device according to claim 1 wherein the dielectric layers, including at least one barrier layer, are selected from the group consisting of ZnSe, SiN, $Al_2O_3$, $Y_2O_3$ and combinations thereof.

6. A device according claim 1 wherein the device is disposed on a silicon substrate.

7. A thin film electroluminescent device according to claim 1 further comprising a number of said devices placed side by side on a substrate, said substrate having a plane, to form a row for use as a printing array and including a suitable solid low refractive index dielectric between each said device to provide waveguiding in a plane parallel to said plane of said substrate.

8. An array according to claim 7 wherein said solid low refractive index dielectric defines sidewalls, said sidewalls having a degree of curvature.

9. An array according to claim 7 wherein the solid low refractive index dielectric comprises $SiO_2$ of SiN.

10. A thin film electroluminescent device according to claim 1 further comprising a die said die supporting a group of individual thin film electroluminescent devices, and mounted upon a silicon substrate, said devices arranged end to end.

11. An electro-optic head according to claim 10 wherein said die is undercut to provide slanted ends.

12. A thin film illuminescent device according to claim 1, further comprising:

a means for applying an ac drive signal to a group of said devices;

first and second electrode layers, said first electrode layer conveying said ac drive signal to said group of devices;

said second electrode layer conveying an in-phase low voltage signal to said devices; and wherein said ac drive signal and said low voltage signal are sufficient to activate said devices.

* * * * *